United States Patent [19]

Kobayashi et al.

[11] Patent Number: 5,698,374

[45] Date of Patent: Dec. 16, 1997

[54] PROCESS FOR THE FORMATION OF AN IMAGE THROUGH ADHESION OF PARTICULATE IMAGE FORMING MATERIAL

[75] Inventors: Kesanao Kobayashi; Masahide Yasui, both of Shizuoka, Japan

[73] Assignees: Fuji Photo Film Co., Ltd., Kanagawa; Fuji-Hunt Electronics Technology Co., Ltd., Shizuoka, both of Japan

[21] Appl. No.: 674,903

[22] Filed: Jul. 3, 1996

[30] Foreign Application Priority Data

Jul. 5, 1995 [JP] Japan .................. HEI. 7-169812

[51] Int. Cl.$^6$ ........................................... G03F 7/28
[52] U.S. Cl. ................................. 430/291; 430/144
[58] Field of Search ........................... 430/144, 291

[56] References Cited

U.S. PATENT DOCUMENTS

| | | | |
|---|---|---|---|
| 4,407,916 | 10/1983 | Akagi et al. | 430/144 |
| 4,681,824 | 7/1987 | Tomita | 430/291 |
| 5,286,595 | 2/1994 | Hertler et al. | 430/144 |
| 5,356,751 | 10/1994 | Cairncross et al. | 430/291 |
| 5,534,380 | 7/1996 | Bodager et al. | 430/144 |

FOREIGN PATENT DOCUMENTS

| | | | |
|---|---|---|---|
| 373193 | 9/1959 | Japan . | |
| 497750 | 1/1968 | Japan . | |
| 1103864 | 2/1968 | United Kingdom | 430/144 |

*Primary Examiner*—Christopher G. Young
*Attorney, Agent, or Firm*—Sughrue, Mion, Zinn, Macpeak & Seas, PLLC

[57] ABSTRACT

A process for the preparation of an image is provided, which comprises exposing to light a layer of a composition which changes its stickiness when irradiated with active light, spraying a particulate image-forming material on to the layer, removing the particulate matter which has not been attached to the layer, and then heating the layer to fix the particulate image-forming to the substrate. This process is suitable for the patterning of not only a fluorescent substance for plasma display but also a light-impermeable or sparingly light-permeable material to which photolithography has heretofore been difficultly applied. Furthermore, the thickness of the image-forming material layer can be easily varied by properly selecting the grain diameter of the image-forming material.

6 Claims, 1 Drawing Sheet

FIGURE
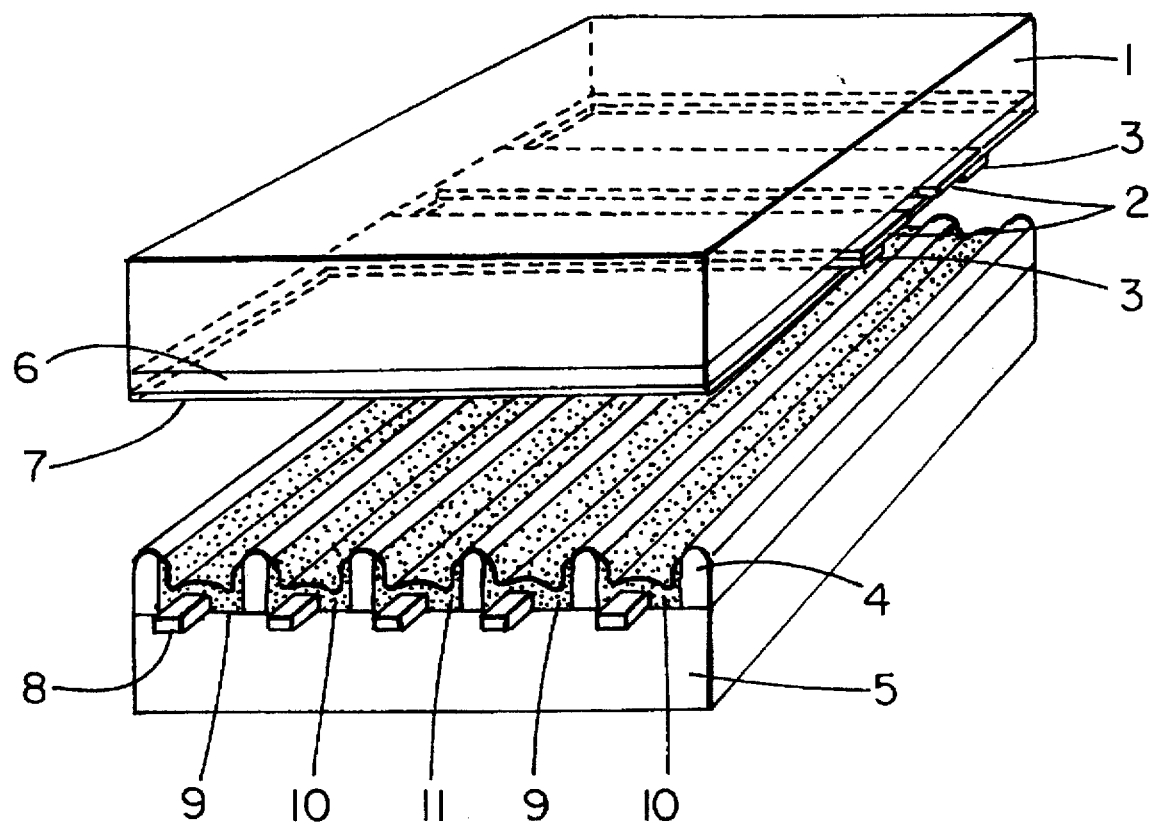

PROCESS FOR THE FORMATION OF AN IMAGE THROUGH ADHESION OF PARTICULATE IMAGE FORMING MATERIAL

FIELD OF THE INVENTION

The present invention relates to a process for the formation of a pattern containing a light-impermeable material by the action of light. More particularly, the present invention relates to a process for patterning fluorescent pigments in a plasm display.

BACKGROUND OF THE INVENTION

A plasma display is adapted to excite three primary color fluorescent substances formed in a panel to emit light when irradiated with ultraviolet light generated by electrical discharge in gas. The panel has a structure shown in FIGURE. The fluorescent substances are formed inside a space enclosed by a partition called as rib. Since the fluorescent layer needs a thickness of from 10 micrometers to scores of micrometers, it is printed on a predetermined place by silk screen printing process. In FIGURE, the reference numerals 1, 2, 3, 4, 5, 6, 7, 8, 9, 10 and 11 indicate a surface glass substrate, a display electrode (transparent electrode), a bath electrode, a partition (rib), a back glass substrate, a dielectric layer, a protective layer (MgO), an address electrode, a fluorescent substance (red), a fluorescent substance (green) and a fluorescent substance (blue), respectively. These red, green and blue fluorescent substances form a pixel.

The height of the rib is around 200 μm. The silk screen printing process is conducted in such a manner that the fluorescent substances are embedded in valleys between these ribs. Therefore, an uneven force is imposed on the silk screen used. Accordingly, the life of the silk screen used in this printing process is short.

One of the targets of plasma display is a 40-inch class high-definition television display. The recent trend for larger display size and higher display precision seems to make the silk screen printing process more difficult.

A high precision patterning is normally accomplished by photolithography. However, since a fluorescent substance is a pigment which does not transmit light, it is almost impossible to form this pattern by light when the required film thickness is around 20 μm.

Further, in order to enhance the luminous efficiency, it is desirable that a fluorescent film be provided on the inner wall of the partition. Moreover, in order to maximize the surface area, it is desirable that the thickness of the film on the bottom be consistent with that of the film formed on the inner wall of the partition.

The process which comprises spraying a pigment or other substances on to a sticking pattern to form an image is known and disclosed in JP-B-37-3193 (The term "JP-B" as used herein means an "examined Japanese patent publication") and JP-B-49-7750. JP-B-37-3193 discloses in examples a process for the formation of a fluorescent image which comprises applying a photopolymerizable composition layer to a support, exposing the photopolymerizable composition layer thus formed to light through a mask, and then spraying a zinc cadmium sulfite fluorescent substance on to the material. However, it does not teach a process for controlling the thickness of the pigment layer thus sprayed.

JP-B-49-7750 discloses a process for controlling the pigment grain diameter to an optimum range to avoid "stain", i.e., attachment of pigment to non-image area. It also discloses how to use "resin matrix", which is referred to "binder" herein. However, the above cited patent does not teach a process for controlling the thickness of the pigment layer.

SUMMARY OF THE INVENTION

It is therefore an object of the present invention to provide a process for the formation of an image made of a light-impermeable image-forming material.

It is another object of the present invention to provide a process for the formation of an image which has a uniform thickness even on a three-dimensional surface.

These and other objects of the present invention will become more apparent from the following detailed description and examples.

The inventors made extensive studies of various processes which comprises forming a sticking image by photolithography, spraying an image-forming material such as fluorescent pigment on to the material so that the image-forming material is attached to the sticking pattern, and then fixing the image-forming material to the sticking pattern. As a result, it was found that the image-forming material can be mixed with a binder to provide a particulate image-forming material having a specific grain size which can be arbitrarily altered so that the thickness of the resulting image-forming material layer such as fluorescent pigment layer can be freely controlled. Thus, the present invention has been worked out.

The essence of the present invention is a process for the preparation of an image, which comprises exposing to light a layer of a composition which changes its stickiness when irradiated with active light, spraying a particulate image-forming material on to the layer, removing the particulate material which has not been attached to the layer, and then heating the layer to fix the particulate image-forming material to a substrate.

BRIEF DESCRIPTION OF THE DRAWING

By way of example and to make the description more clear, reference is made to the accompanying drawings in which:

FIGURE is a perspective view illustrating a representative example of the structure of a plasma display panel which is adapted to excite three color fluorescent substances to emit light when irradiated with ultraviolet light generated by electric discharge in gas, wherein the reference numerals 1, 2, 3, 4, 5, 6, 7, 8, 9, 10 and 11 indicate a surface glass substrate, a display electrode, a bath electrode, a partition, a back glass substrate, a dielectric layer, a protective layer, an address electrode, a fluorescent substance (red), a fluorescent substance (green) and a fluorescent substance (blue), respectively.

DETAILED DESCRIPTION OF THE INVENTION

The present invention will be further described below.

As the composition which changes its stickiness when irradiated with active light there may be used a material which is sticky itself but loses its stickiness when irradiated with active light, e.g., photopolymerizable composition disclosed in U.S. Pat. No. 3,549,367.

The photopolymerizable composition comprises an addition-polymerizable unsaturated monomer, a photopolymerization initiator, and if needed, a binder resin. The addition-polymerizable unsaturated monomer is a compound containing at least one addition-polymerizable ethylenically unsaturated group and a boiling point of not lower than 100° C. at ordinary pressure. Specific examples of the addition-polymerizable unsaturated monomer include monofunctional acrylates or methacrylates such as polyethylene glycol mono(meth)acrylate, polypropylene glycol mono(meth)acrylate and phenoxy ethyl (meth)acrylate, and multi-functional acrylates or methacrylates such as compounds obtained by adding ethylene oxide or propylene oxide to a multifunctional alcohol, and then (meth) acrylating the adduct, e.g., polyethylene glycol di(meth) acrylate, trimethylolethane tri(meth)acrylate, neopentyl glycol (meth)acrylate, pentaerythritol tri(meth)acrylate, pentaerythritol tetra(meth)acrylate, dipentaerythritol hexa (meth)acrylate, hexanediol (meth)acrylate, trimethylolpropane tri(acryloyloxyproyl)-ether, tri(acryloyloxyethyl) isocyanurate, glycerin and trimethylolethane, urethane acrylates disclosed in JP-B-48-41708, JP-B-50-6034, and JP-A-51-37193 (The term "JP-A" as used herein means an "unexamined published Japanese patent application"), polyester acrylates disclosed in JP-A-48-64183, JP-B-49-43191, and JP-B-52-30490, and epoxy acrylates as reaction product of epoxy resin with (meth)acrylic acid.

Further, compounds as cited as photosetting monomers and oligomers in *Journal of the Adhesion Society of Japan*, Vol. 20, No. 300–308 can be used.

The foregoing monomer normally stays liquid or waxy. The monomer can be mixed with the binder resin in a proper ratio to form a sticking coating film. The proportion of the monomer to the binder resin is normally from 30 to 100% by weight, preferably from 40 to 100% by weight. If the coating film can be formed by the monomer or oligomer alone, it is not necessary to use the binder resin. The foregoing monomer or oligomer may be used singly. Alternatively, a plurality of monomers or oligomers may be used in admixture.

Examples of the photopolymerization initiator employable herein include vicinal polyketoaldonyl compounds disclosed in U.S. Pat. No. 2,367,660, α-carbonyl compounds disclosed in U.S. Pat. Nos. 2,367,661 and 2,367,670, acyloin ethers disclosed in U.S. Pat. No. 2,448,828, α-hydrocarbon-substituted aromatic acyloin compounds disclosed in U.S. Pat. No. 2,722,512, polynuclear quinone compounds disclosed in U.S. Pat. Nos. 3,046,127 and 2,951,758, combination of triallylimidazole dimer and p-aminophenylketone disclosed in U.S. Pat. No. 3,549,367, combination of benzothiazole compound and trihalomethyl-s-triazine compound disclosed in JP-B-51-48516, photosensitive s-triazine compounds disclosed in Japanese Patent Application No. 61-186238, trihalomethyl-s-triazine compounds disclosed in U.S. Pat. No. 4,239,850, and oxadiazole compounds disclosed in U.S. Pat. No. 4,212,976. However, the present invention is not limited to these compounds.

The amount of the photopolymerization initiator to be used is normally from about 0.2 to 30% by weight, preferably from 0.5 to 20% by weight based on the weight of the monomer.

As the binder resin which can be incorporated in the photo-polymerizable composition there may be preferably used a linear organic high molecular polymer which is compatible with the foregoing monomer and can be dissolved in an organic solvent. As such a linear organic high molecular polymer there may be used a polymer having carboxylic acid in its side chains, such as methacrylic copolymer, acrylic copolymer, itaconic copolymer, crotonic copolymer, maleic copolymer and partially-esterified maleic copolymer disclosed in JP-A-59-44615, JP-B-54-34327, JP-B-58-12577, JP-B-54-25957, JP-A-59-53836 and JP-A-59-71048, or acidic cellulose derivative having carboxylic acid in its side chains. As the binder resin there may be also used an adduct of a hydroxyl-containing polymer with an acid anhydride. Particularly preferred among these adducts are benzyl (meth)acrylate/(meth)acrylic acid copolymer and copolymer of benzyl (meth)acrylate, (meth)acrylic acid and other monomers. Besides these compounds, polyvinyl pyrrolidone, polyethylene oxide and polyvinyl alcohol as water-soluble polymers are useful. Further, alcohol-soluble nylon, acrylic ester polymer or copolymer, and polyether of 2,2-bis-(4-hydroxyphenyl)propane with epichlorohydrin can be used to enhance the strength of the cured film.

The foregoing photopolymerizable composition may comprise a heat polymerization inhibitor incorporated therein to enhance the storage stability thereof. Useful examples of such a heat polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylene(4-methyl-6-t-butylphenol), and 2-mercaptobenzoimidazole. Such a heat polymerization inhibitor may be normally incorporated in the photopolymerizable composition in an amount of from 500 to 2,000 ppm based on the weight of the monomer used. In general, commercially available monomers comprise a proper amount of a heat polymerization inhibitor incorporated therein.

The composition thus obtained may be optionally dissolved in a low toxicity solvent having good coating properties before being applied to the substrate. Examples of the solvent employable herein include alkoxypropionic esters such as 3-methoxypropionic methylester, 3-methoxypropionic ethylester, 3-methoxypropionic propylester, 3-ethoxypropionic methylester, 3-ethoxypropionic ethylester and 3-ethoxypropionic propylester, alkoxyalcohol esters such as 2-methoxypropyl acetate, 2-ethoxypropyl acetate and 3-methoxypropyl acetate, lactic esters such as methyl lactate and ethyl lactate, ketones such as methylethyl ketone, cyclohexanone and methylcyclohexanone, γ-butyrolactone, N-methylpyrrolidone and dimethyl sulfoxide.

As the substrate (optionally support) employable herein there is used an ordinary glass.

The application of the foregoing composition to the substrate (and/or support) can be accomplished by means of a spinner, roll coater, bar coater, curtain coater, spray or shower. In order to leave the coating film uniformly on the surface of the substrate and the sidewall of the rib in a necessary amount, it is desirable that excess composition be removed after coating. The removal of excess composition can be accomplished by suction, blowing or centrifugal separation. Alternatively, the substrate may be inverted or allowed to stand against something.

Most monomers or oligomers in the photopolymerizable composition normally stay liquid. Accordingly, if the mixing ratio of the monomer or oligomer to the binder resin is appropriately selected, the photopolymerizable composition still stays sticky even after dried to lose the solvent.

The coating film made of the foregoing photopolymerizable composition undergoes polymerization reaction when irradiated with active light to cause the monomer or oligomer to disappear and hence lose its stickiness.

The unirradiated area shows no change of stickiness. Therefore, when a particulate image-forming material is sprinkled over the coating film, it is attached to the sticky area. The particulate image-forming material may be sprayed on to or rubbed on the coating film instead of being sprinkled.

The coating film is patternwise exposed to light through a mask, sprinkled with the particulate image-forming material, and then subjected to suction, blowing or brushing to remove excess particulate matter, thereby forming an image of particulate matter.

A representative example of the image-forming material to be used herein is a fluorescent substance, but the present invention is not limited thereto. For example, light-impermeable or sparingly light-permeable materials such as finely divided particles (or powder) of metal, transition metal, alkaline earth metal, or an oxide thereof, e.g., gold, silver, platinum, aluminum, copper, ITO (indium tin oxide), carbon black, graphite and titanium oxide, can be used. Further, the present invention is suitable for the patterning of a material to which photolithography has heretofore been difficultly applied.

The image-forming material of the present invention is normally mixed with a binder to provide a particulate solid matter having a predetermined uniform grain diameter before use. The grain size is normally from 1 to 1,000 μm, preferably from 10 to 200 μm.

By changing the grain size, the thickness of the pattern-forming layer can be controlled to a predetermined range, normally from 10 to 200 μm.

As the binder which may be mixed with the image-forming material to provide a particulate solid matter, a combustible material which can be heat-fused, e.g., sugar, citric acid, succinic acid and malonic acid is most suitable. However, the present invention is not limited to these materials. Cellulose acetate, ethyl cellulose, cellulose acetate butyrate, water-soluble polyvinyl alcohol, carboxymethyl cellulose, sodium salt of cellulose hydrogen phthalate, etc. may be used as well.

In the procedure of mixing the fluorescent substance with the binder to provide a desired particulate matter, glass is preferably mixed into the system as a fixing agent. In this manner, when the binder is burnt away, the glass melts to cause the fluorescent substance to be fixed to the substrate.

The fluorescent substance can be retained without any fixing agent but can be retained more firmly with some fixing agent. As such a fixing agent there may be preferably used a material which does not prevent the fluorescent substance from emitting light at a sufficient luminous efficiency when irradiated with ultraviolet light.

As the ultraviolet-excited fluorescent substances there have been well known the following compounds:
Red:$Y_2O_3$:Eu, $YVO_4$:Eu, $(Y, Gd)BO_3$:Eu
Green:$BaAl_{12}O_{19}$:Mn, $Zn_2SiO_4$:Mn
Blue:$BaMgAl_{14}O_{23}$:Eu, $BaMgAl_{16}O_{27}$:Eu The particulate image-forming material such as fluorescent substance is attached to the sticking layer. The particulate image-forming material which has not been attached to the sticking layer is then removed. The sticking layer is then heated to melt the binder. After the particulate image-forming material such as fluorescent substance formed an uniform layer, the heating temperature is raised so that the material is heated to a temperature of 400° C. to 500° C. In this manner, the photosensitive layer and the binder are burnt away to fix the particulate image-forming material to the substrate.

In the case of color display, red, green and blue patterns are required. These patterns can be accomplished by repeating the foregoing procedure.

The present invention will be further described in the following examples, but the present invention should not be construed as being limited thereto.

EXAMPLE 1

Photopolymerizable Composition (Stickiness-providing Material Composition)

| | |
|---|---|
| Benzyl methacrylate/methacrylic acid copolymer (molar ratio: 70/30; weight average molecular weight $\Sigma_w$: 20,000) | 32 g |
| Pentaerythritol tetraacrylate | 68 g |
| 4-[O-bromo-p-N,N-di(ethoxycarbonylmethyl) aminophenyl]-2,6-di(trichloromethyl)-s-triazine | 4 g |
| 2-Benzoylmethylene-3-methyl-β-naphthothiazoline | 2 g |
| Hydroquinone monomethyl ether | 0.01 g |
| Propylene glycol monomethyl ether acetate | 650 g |
| Composition of Fluorescent Pigment | |
| $Y_2O_3$:Eu | 100 g |
| Sugar | 20 g |
| Sodium salt of cellulose hydrogenphthalate | 2 g |
| Sorbitan monopalmitate (Span 40) | 0.3 g |
| Water | 800 g |
| Ethyl alcohol | 100 g |

A solution having the foregoing composition was prepared. The solution was then subjected to dispersion by means of a sand mill so that the fluorescent substance $Y_2O_3$:Eu was homogeneously dispersed in the solution. The dispersion thus obtained was then sprayed into a hot-air drier to obtain a pigment having an average grain diameter of 20 μm.

On the other hand, on to the entire surface of a glass substrate having an electrode and a rib formed thereon as shown in FIGURE was curtain-flown the photosensitive solution having the foregoing formulation. The substrate was then tilted in such a manner that the rib swings vertically to remove excess solution. The substrate was then dried. The substrate was then exposed to light through a mask on the area where no fluorescent layer was formed. Thereafter, a pigment comprising a fluorescent substance bound with a binder was sprayed on to the entire surface of the substrate. Excess pigment was then removed with suction. In this manner, the pigment was attached to the surface of the substrate having an electrode and the sidewall of the rib standing at right angles to the surface of the substrate. Subsequently, the glass substrate was put into an electric furnace which had been heated to a temperature of 250° C. After 10 minutes, the heating temperature was raised to 550° C. in about 30 minutes. In this stage, the photosensitive layer made of a photopolymerizable composition (area cured by exposure and unexposed area to which the fluorescent pigment had been attached) and the binder in the fluorescent substance were completely burnt away. If these materials can be hardly burnt, combustion can be effected by blowing oxygen. The glass substrate was allowed to gradually cool to room temperature, and then withdrawn from the electric furnace. The glass substrate had a fluorescent substance layer having a thickness of about 20 μm formed uniformly on the surface thereof having an electrode and on the sidewall of the rib standing at right angles to the surface of the substrate.

On the contrary, an ink-like dispersion having a fluorescent substance dispersed in a resin solution was injected into valleys between the ribs by silk screen printing process according to the conventional process. In this case, since the height of the rib was about 200 μm, the ink-like dispersion was dropped into the 200-μm deep valleys and thus couldn't be firmly fixed to the surface of the substrate. Accordingly, when the resin used as a vehicle for the fluorescent substance was burnt away, the resulting layer easily became whiskery and ununiform.

EXAMPLE 2

Photopolymerizable Composition (Stickiness-providing Material Composition)

| Methyl methacrylate polymer | 42 g |
|---|---|
| Trimethylol propane trimethacrylate | 58 g |
| 2-(Naphtho-1-il)-4,6-bis-trichloromethyl-s-triazine | 4 g |
| Hydroquinone monomethyl ether | 0.01 g |
| Ethyl ethoxy propionate | 650 g |
| Composition of Pigment | |
| Silver powder | 100 g |
| Sodium salt of cellulose hydrogen phthalate | 20 g |
| Sorbitan monopalmitate (Span 40) | 0.3 g |
| Water | 500 g |
| Ethyl alcohol | 100 g |

A solution having the foregoing formulation was prepared. The solution was then subjected to dispersion by means of a sand mill in such a manner that the silver powder was homogeneously dispersed in the solution. The dispersion was then sprayed into a hot-air drier to obtain a pigment having an average grain diameter of 10 µm.

The photopolymerizable composition solution was then spin-coated onto a glass substrate. The glass substrate was then put into a 110° C. convection oven for 5 minutes to allow the solvent to evaporate. Even after cooled, the coating surface stayed sticky. Therefore, the coating surface was patternwise exposed to light by means of a projection type exposing machine which does not require a process comprising contact with a mask. Subsequently, the pigment comprising a silver powder bound with a binder was sprayed on to the entire surface of the coating surface. Excess pigment was then removed with suction. The spraying of the pigment was carried out by means of an apparatus having two slits provided about 2 cm apart, one for blowing a pigment and the other for sucking excess pigment in. Subsequently, the glass substrate was put into an electric furnace which had been heated to a temperature of 250° C. After 10 minutes, the heating temperature was raised to 550° C. in about 30 minutes. In this stage, the photosensitive layer made of a photopolymerizable composition (area cured by exposure and unexposed area to which the fluorescent pigment had been attached) and the binder in the fluorescent substance were completely burnt away. If these materials can be hardly burnt, combustion can be by blowing oxygen. The glass substrate was allowed to gradually cool to room temperature, and then withdrawn from the electric furnace. The glass substrate had a 10-µm thick silver pattern formed thereon.

EXAMPLE 3

Photopolymerizable Composition (Stickiness-providing Material Composition

| Butyl methacrylate/methacrylic acid copolymer (molar ratio: 70/30; weight average molecular weight $\Sigma_w$: 20,000) | 35 g |
|---|---|
| Pentaerythritol tetraacrylate | 65 g |
| 2-(4-Methoxy-naphtho-1-il)-4,6-bis-trichloromethyl-s-triazine | 6.5 g |
| Hydroquinone monomethyl ether | 0.01 g |
| 3-Methoxybutyl acetate | 650 g |

-continued

| Composition of Pigment | |
|---|---|
| ITO powder | 100 g |
| Sodium salt of cellulose hydrogen phthalate | 20 g |
| Sorbitan monopalmitate (Span 40) | 0.3 g |
| Water | 500 g |
| Ethyl alcohol | 100 g |

A solution having the foregoing formulation was prepared. The solution was then subjected to dispersion by means of a sand mill in such a manner that the ITO silver powder was homogeneously dispersed in the solution. The dispersion was then sprayed into a hot-air drier to obtain a pigment having an average grain diameter of 1 µm.

The photopolymerizable composition solution was then spin-coated onto a glass substrate. The glass substrate was then processed in the same manner as in Example 2 to obtain an ITO pattern having a thickness of 1 µm.

Thus, the layer of a pattern-forming material such as fluorescent substance prepared according to the process of the present invention is uniformly formed all over the surface of the substrate having an electrode and the sidewall of the rib standing at right angles to the surface of the substrate. Accordingly, a pattern having a uniform thickness can be formed on the three-dimensional surface.

In other words, the process of the present invention allows the photolithographic patterning of a pigment layer having a thickness of from 10 to 200 µm or more.

Further, in the present invention, the thickness of the fluorescent layer can be easily varied by properly selecting the grain diameter of the fluorescent pigment.

Moreover, the present invention is suitable for the patterning of a material to which photolithography has heretofore been difficultly applied, e.g., light-impermeable or sparingly light-permeable materials such as finely divided particles of metal, transition metal, alkaline earth metal, or an oxide thereof (e.g., gold, silver, platinum, aluminum, copper, ITO (indium tin oxide), carbon black, graphite and titanium oxide.

While the invention has been described in detail and with reference to specific embodiments thereof, it will be apparent to one skilled in the art that various changes and modifications can be made therein without departing from the spirit and scope thereof.

What is claimed is:

1. A process for the preparation of an image, which comprises exposing to light a layer of a composition which changes its stickiness when irradiated with active light, spraying a particulate image-forming material on to the layer, the particulate image-forming material comprising a binder selected from the group consisting of sugar, citric acid, succinic acid, malonic acid and mixtures thereof, removing the particulate image-forming material which has not been attached to the layer, and then heating the layer to fix the particulate image-forming material to a substrate.

2. The process of claim 1, wherein the composition comprises an addition-polymerizable unsaturated monomer and a photo-polymerization initiator.

3. The process of claim 1, wherein the particulate image-forming material comprises a fluorescent substance.

4. The process of claim 1, wherein the particulate image-forming material comprises finely divided particles or powder of metal, transition metal, alkaline earth metal, or an oxide thereof.

5. The process of claim 4, wherein the particulate image-forming material comprises at least one selected from the group consisting of gold, silver, platinum, aluminum, copper, ITO (indium tin oxide), carbon black, graphite and titanium oxide.

6. The process of claim 1, wherein the particulate image-forming material has a grain size of from 1 μm to 1,000 μm.

* * * * *